United States Patent [19]

Cartagena

[11] Patent Number: 5,374,567
[45] Date of Patent: Dec. 20, 1994

[54] OPERATIONAL AMPLIFIER USING BIPOLAR JUNCTION TRANSISTORS IN SILICON-ON-SAPPHIRE

[75] Inventor: Eric N. Cartagena, Chula Vista, Calif.

[73] Assignee: The United States of America as represented by the Secretary of the Navy, Washington, D.C.

[21] Appl. No.: 65,321

[22] Filed: May 20, 1993

[51] Int. Cl.$^5$ .................................. H01L 21/265
[52] U.S. Cl. .................................. 437/31; 437/21; 437/84; 437/247; 148/DIG. 150; 148/DIG. 77
[58] Field of Search .............. 437/31, 21, 84, 247, 437/32; 148/DIG. 77, DIG. 150

[56] References Cited

U.S. PATENT DOCUMENTS

| | | | |
|---|---|---|---|
| 3,943,555 | 3/1976 | Mueller et al. | 148/1.5 |
| 4,050,965 | 9/1977 | Ipri et al. | 148/175 |
| 4,109,272 | 8/1978 | Herbst et al. | 357/35 |
| 4,177,084 | 12/1979 | Lau et al. | 148/DIG. 77 |
| 4,509,990 | 4/1985 | Vasudev | 148/1.5 |
| 4,659,392 | 4/1987 | Vasudev et al. | 437/247 |
| 4,753,895 | 6/1988 | Mayer et al. | 148/DIG. 77 |
| 4,965,872 | 10/1990 | Vasudev | 357/35 |

OTHER PUBLICATIONS

Prahalad K. Vasudev, "Recent Advances in Solid-Phase Epitaxial Recrystallization of SOS with Applications to CMOS and Bipolar Devices", *IEEE*, Jul. 1987, pp. 17-19.

F. P. Heiman and P. H. Robinson, "Silicon-On-Sapphire Epitaxial Bipolar Transistors", *Solid-State Electronics*, vol. 11, 1968, pp. 411-417.

E. N. Cartagena, B. Offord, and G. Garcia, "Bipolar Junction Transistors Fabricated in Silicon-On-Sapphire", *Electronics Letters*, vol. 28, No. 11, 21 May 1992, pp. 983-985.

Anil Gupta and Prahalad K. Vasudev, "Recent Advances in Hetero-Epitaxial Silicon-On-Insulator Technology", *Solid State Technology*, Feb. 1983, pp. 104-109.

Tomoyasu Inoue and Toshio Yoshii, "Crystalline Reduction and Defect-Type Change in Silicon On Sapphire Films by Silicon Implantation and Subsequent Thermal Annealing", *Appl. Phys. Lett.*, vol. 36, No. 1, 1 Jan. 1980, pp. 64-65.

Anil Gupta, "Recent Advances in Hetero-Epitaxial Silicon-on-Insulator Technology", *Solid State Technology*, Jun. 1983, pp. 129-134.

*Primary Examiner*—Tom Thomas
*Assistant Examiner*—Tuan Nguyen
*Attorney, Agent, or Firm*—Harvey Fendelman; Thomas Glenn Keough; Peter A. Lipovsky

[57] ABSTRACT

A method for fabricating low leakage current bipolar junction transistors of silicon-on-sapphire for efficient use in operational amplifiers utilizes all implant technology, improved silicon conditioning processing, and low temperature annealing.

8 Claims, 9 Drawing Sheets

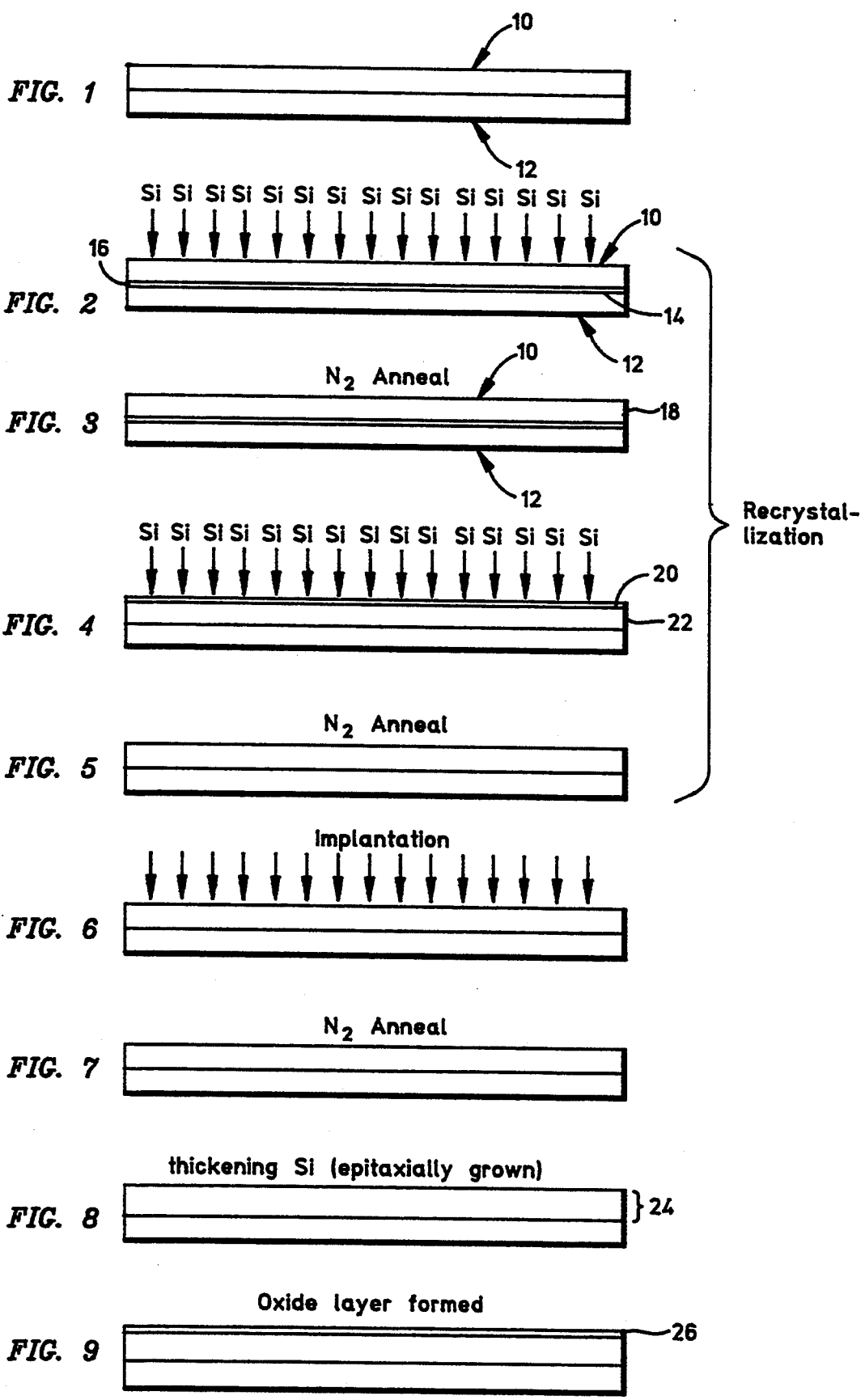

OPERATIONAL AMPLIFIER USING BIPOLAR JUNCTION TRANSISTORS IN SILICON-ON-SAPPHIRE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

This invention pertains broadly to the field of semiconductors. More particularly, the invention pertains to bipolar junction transistors fabricated in silicon on a sapphire substrate. In still greater particularity, this invention pertains to an operational amplifier using bipolar junction transistors fabricated in silicon-on-sapphire.

2. Description of the Related Art

Bipolar junction transistors (BJT's) fabricated in silicon-on-sapphire (SOS) have several distinct advantages over their bulk silicon counterparts. For one, total isolation between electronic devices can be obtained by etching silicon islands into a sapphire substrate. As devices may be completely isolated from each other, latch-up-free operation is possible.

Because of the devices' sapphire insulating substrate, there is a reduction in collector-to-substrate capacitance. This reduced capacitance may give rise to a 12 percent decrease in emitter-coupled-logic (ECL) gate delay. In addition, as all interconnecting lines are on the insulating sapphire substrate, the lines contribute little parasitic capacitance and permit high-voltage and high-frequency components to exist in close proximity.

It is also known that devices fabricated in SOS show that radiation-induced photocurrents are three orders of magnitude lower than in bulk silicon, making a very radiation-hard technology suitable for use in transient ionizing radiation and cosmic ray environments.

Bipolar junction transistors have been fabricated in silicon-on-sapphire films with a varying degree of success. Most of the development of BJT's in SOS have been concentrated in the area of lateral BJT's, epitaxial silicon grown BJT's and heteroepitaxy BJT's. This work has been recorded respectively by Prahalad K. Vasudev in his July 1987 article of *IEEE Circuits and Devices* magazine titled "Recent Advances in Solid-Phase Epitaxial Recrystallization of SOS with Applications to CMOS and Bipolar Devices", July 1987, pp. 17–19; by Heiman, F. P. and P. H. Robinson, in their *Solid State Electronics* article titled "Silicon-on-Sapphire Epitaxial Bipolar Transistors" of 1968, Volume 11, pages 411–418; and by Cartagena, E. N., B. W. Offord, and G. Garcia, in their article "Bipolar junction transistors fabricated in silicon-on-sapphire" printed in *Electronics Letters*, Volume 28, Number 11, pages 983–985 of May 21, 1992.

The success of SOS devices has in part been dependent upon the quality of the silicon starting material. For example, high emitter-to-collector leakage current has been experienced due to excessive recombination in the device-based emitter regions and due to emitter collector shorts. Further leading to excessive leakage current is the use of drive-in diffusion to fabricate the bipolar junction transistors. The high temperatures involved and the often excessive driving of a dopant on an emitter are two characteristics of drive-in diffusion considered to contribute to the high leakage current.

Because of the high leakage current exhibited by the BJT's, the pursuit of analog and digital applications on SOS films has been deterred. This has been particularly true in the fabrication of operational amplifiers utilizing bipolar junction transistors made in silicon-on-sapphire. Lateral device operational amplifiers have been fabricated; however, the slow speed of these lateral devices and the difficulty in manufacturing the devices in a reliable manner have permitted the construction of operational amplifiers of only small operating bandwidths. These devices also suffer from the high current leakage described above. Such limitations have made further pursuit of lateral device operational amplifiers constructed of bipolar junction transistors fabricated in silicon-on-sapphire films unfeasible.

The more rapid speed of vertical devices have made them attractive for use in operational amplifiers; however, the use of vertical bipolar junction transistors fabricated in silicon-on-sapphire has not been seriously considered because of the high leakage current plaguing these devices.

Recent successes in improving the quality of silicon starting material by recrystallization techniques have now made Silicon-on-Sapphire a desirable candidate material for BJTs. One such process, known as the double solid phase epitaxy (DSPE) technique, has been described by Prahalad K. Vasudev in his July 1987 *IEEE Circuits and Devices* article described above. This process is also described in an article co-authored by Mr. Vasudev with Anil Gupta in their February 1983 article titled "Recent Advances in Heteroepitaxial Silicon-on-Insulator Technology, Part I" found in *Solid State Technology*, Volume 26, Number 2, pp. 104–109.

While the DSPE process is a way in which to improve bipolar junction transistors fabricated in silicon-on-sapphire, further improvements are considered desirable to make such devices practical for use in operational amplifiers.

SUMMARY OF THE INVENTION

The invention is a method for fabricating low leakage current bipolar junction transistors of silicon-on-sapphire for efficient use in operational amplifiers. The vertical or laterally operating transistors are kept to low leakage current by utilizing all implant technology, improved silicon conditioning processing, and low temperature annealing.

OBJECTS OF THE INVENTION

It is an object of the invention to provide an improved method for fabricating bipolar junction transistors.

Another object of the invention is to provide an improved method for fabricating bipolar junction transistors in silicon-on-sapphire.

Yet a further object of the invention is to provide an improved method for fabricating bipolar junction transistors in silicon-on-sapphire in which the bipolar junction transistors exhibit relatively low leakage current.

Yet another object of this invention is to provide bipolar junction transistors in silicon-on-sapphire that are may be practically used in operational amplifiers.

Other objects, advantages and new features of the invention will become apparent from the following detailed description of the invention when considered in conjunction with the accompanied drawings.

BRIEF DESCRIPTION OF THE DRAWINGS

FIGS. 1-37 show steps in fabricating a bipolar junction transistor in silicon-on-sapphire according to the invention.

DESCRIPTION OF TIME PREFERRED EMBODIMENT

Figure 10:
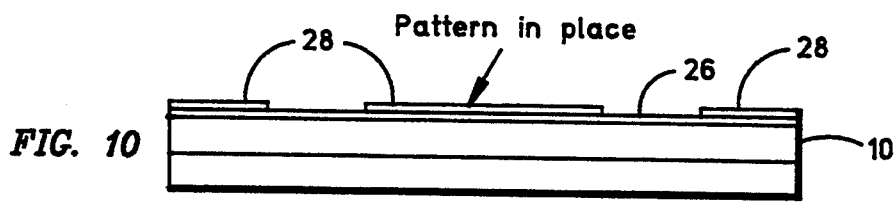

Referring now to FIGS. 1-37 there is disclosed a series of semiconductor processing steps according to the invention. These steps are used to fabricate relatively low leakage current bipolar junction transistors in silicon-on-sapphire. The particular BJT illustrated is a vertical type. However, those skilled in the art will realize that the process of the invention may be used to construct other types of transistors as well.

In an actual fabrication of the bipolar junction transistors according to the invention, wafers 100 millimeters in diameter with an initial intrinsic thickness of 2700 angstroms were utilized.

Referring to FIG. 1, a thin wafer of silicon 10 is grown on a sapphire substrate 12 by a common method such as heteroepitaxy. The quality of the grown silicon is then improved by a recrystallization technique such as DSPE. Such a process is illustrated in FIGS. 2-5 and begins, with reference to FIG. 2, with the amorphisation of silicon wafer 10 at silicon-sapphire interface 14. The amorphisation of silicon wafer 10 occurs roughly in interface region 16 and is accomplished by using an implant of $Si^{28}$ at an energy level of 185 kilo electron volts (KeV) and at a dose of $6 \times 10^{14}$ ion/cm$^2$, for example.

The recrystallization improvement process further includes an anneal in an inert gas such as $N_2$ to recrystallize silicon wafer 10 using non-amorphised upper region 18 as a seed. This is shown in FIG. 3.

The next step is illustrated in FIG. 4. This is the amorphisation of the silicon at its surface layer 20 accomplished by using a shallow implant of $Si^{28}$ at an energy level of 100 KeV and an implant dose of $10^{15}$ ion/cm$^2$, for example.

Referring to FIGS. 4 and 5, a final anneal in an ambient such as $N_2$ recrystallizes the silicon surface layer 20 using non-amorphised bottom layer 22 as a seed, completing the recrystallization process.

In FIG. 6, an implantation is performed depending on the type of transistor desired, NPN or PNP. For example, in NPN devices a buried layer is formed in silicon wafer 10 by ion implantation of, for example, phosphorous at 80 KeV at a dose of $3 \times 10^{15}$ ion/cm$^2$. A PNP buried layer may be formed in wafer 10 using a boron implantation at 30 KeV with a dose of $1.5 \times 10^{15}$ ion/cm$^2$ followed by a second boron dose of $1.5 \times 10^{15}$ ion/cm$^2$ at 70 KeV.

As shown in FIG. 7, the NPNs and PNPs will then be annealed in separate furnaces in an $N_2$ ambient. In FIG. 8 it is shown that a silicon layer is epitaxially grown to a final desired silicon thickness according to the nature of the device desired. For example, a 3.0 $\mu$m n-type epitaxial layer with a nominal doping density of $10^{16}$ ion/cm$^3$ can be grown on NPN wafers. Similarly, for example, a 3.0 $\mu$m epitaxial p-type layer with a nominal doping density of $10^{16}$ ion/cm$^3$ can be grown on the PNP wafers.

In FIG. 9 it can be seen that after the epitaxial growth, a thin layer of oxide 26 is deposited uniformly across the wafer. In the process Of the invention practiced, this oxide layer was approximately 1000 angstroms$\pm 10\%$.

Figure 11:
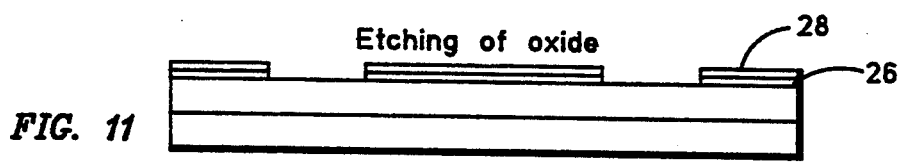
Figure 12:
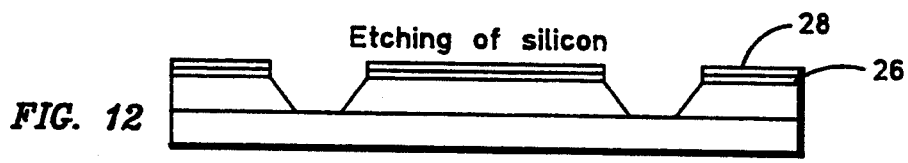
Figure 13:
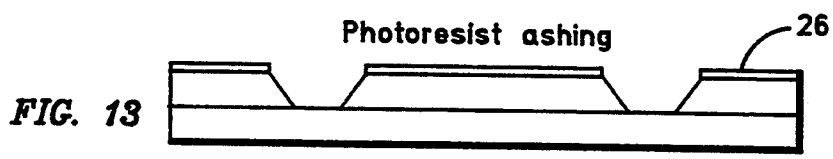
Figure 14:
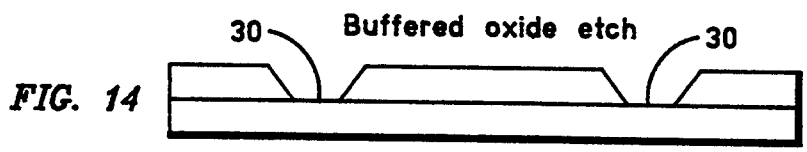

Referring now to FIG. 10, a photolithographic mask or pattern 28 is used to pattern silicon wafer 10 with oxide 26 for an island isolation step. As can be seen in FIG. 11, oxide 26 is removed by etching in areas where silicon 10 is to be exposed. Such etching may be done by using a buffered oxide etch. In FIG. 12 a subsequent etching takes place, such as by phosphoric acid, at an elevated temperature of approximately 100° C.$\pm 10\%$ for example to remove silicon where it is not desired. A subsequent photoresist ashing step, FIG. 13, removes the leftover photoresist or pattern 28 shown in FIG. 12. Another etching step is shown in FIG. 14, and is done with a buffered oxide, for example, to remove the remaining oxide 26 to leave pockets of silicon 30 on which devices are to be fabricated.

Figure 15:
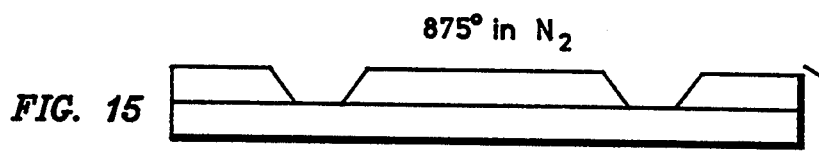
Figure 16:
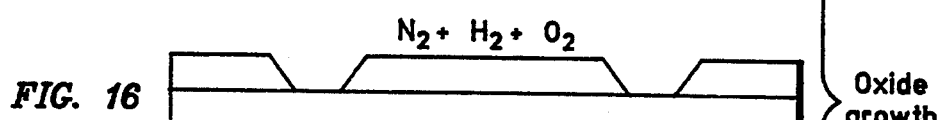
Figure 17:
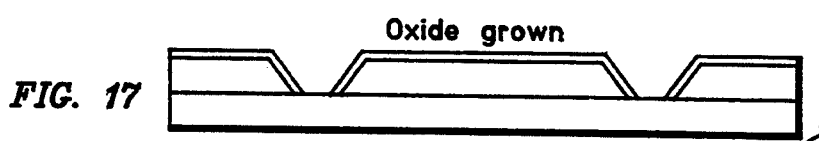

The wafer then goes through an oxide growth stage illustrated in FIGS. 15-17. At the beginning of this stage, as illustrated in FIG. 15, the wafer is placed in a furnace at 875° C.$\pm 10\%$, for example. The ambient gas may be nitrogen as the wafer is pushed into the furnace. As shown in FIG. 16, once the wafer is completely inside the furnace hydrogen and oxygen may be added to the ambient to provide an oxidizing atmosphere for an oxide growth of 250 angstroms$\pm 10\%$, for example. After the oxide has been grown, FIG. 17, the wafer is slowly pulled out of the furnace into a controlled ambient such as nitrogen.

Figure 38:
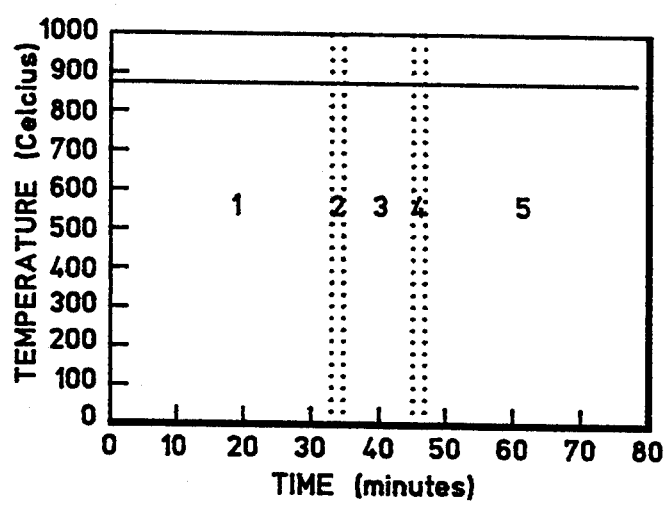
FIG. 38 illustrates an exemplary furnace profile for oxide growth as may be used in the invention.

An exemplary furnace profile for this oxide growth stage is shown in FIG. 38. This profile as well as others to follow all have five interval sections listed in their display. Interval 1 is a push cycle where wafers are being moved into a furnace. Interval 2 is usually a temperature ramp up to an oxidizing or anneal temperature, whichever is applicable. Interval 3 is usually where oxidation or annealing takes place. Interval 4 is usually a temperature ramp down and interval 5 is a final pull from the furnace.

Figure 18:
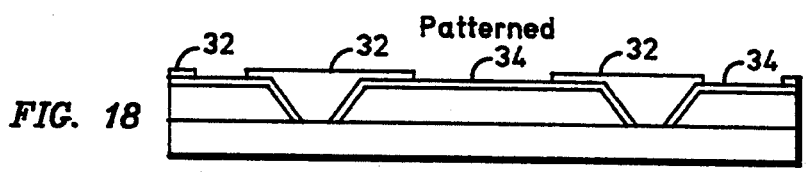
Figure 19:
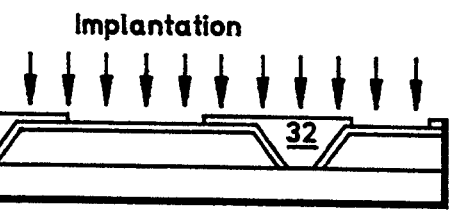

As shown in FIG. 18, after the oxide growth the wafer is patterned 32 with intrinsic base photo level. Open patterned areas 34 on the intrinsic base level define the regions for an active base area of the transistor to be fabricated. As shown in FIG. 19, the wafer is then implanted with desired species (such as boron, phosphorous) applied at an appropriate dose and energy level to yield desired electrical results.

Figure 20:
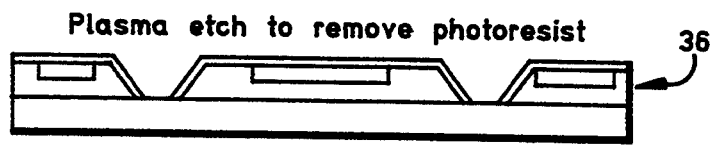
Figure 21:
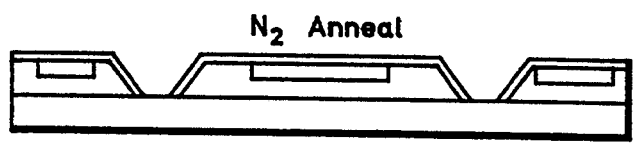
Figure 39:
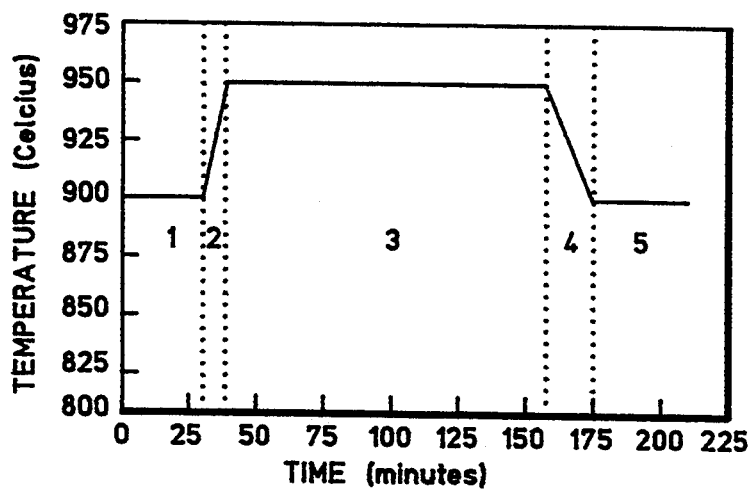
FIG. 39 is an exemplary furnace profile for an annealing step as may be utilized in the invention.

As shown in FIG. 20, photoresist pattern 32 is removed through a process such as plasma etching. In FIG. 20 a p-type silicon (intrinsic base) 36 is shown. A subsequent furnace operation anneals damage done to the wafer and moves inactive implanted species into the crystal lattice of the silicon, making it electrically active. This step, shown in FIG. 21, is further described by the exemplary furnace profile of FIG. 39. The ambient gas used throughout this annealing process may be nitrogen.

Figure 22:
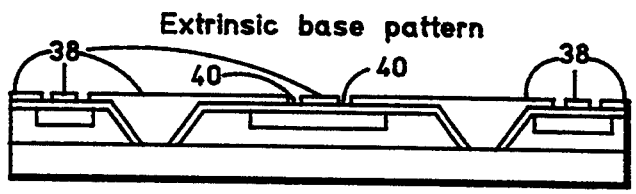
Figure 23:
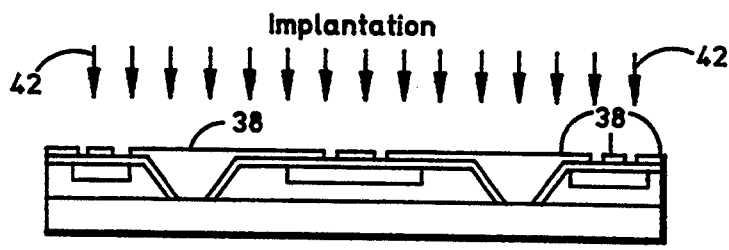
Figure 24:
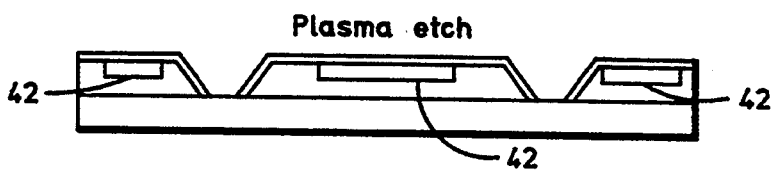
Figure 25:
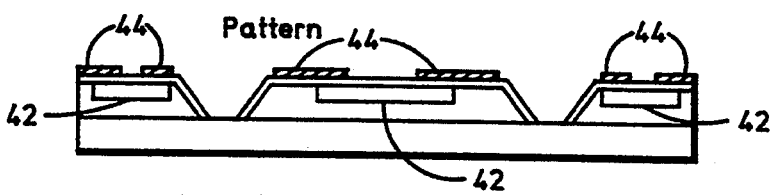
Figure 26:
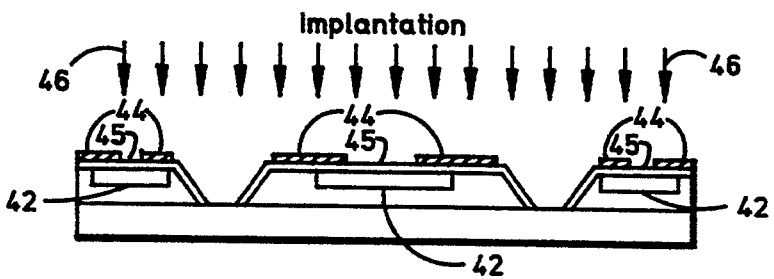
Figure 27:
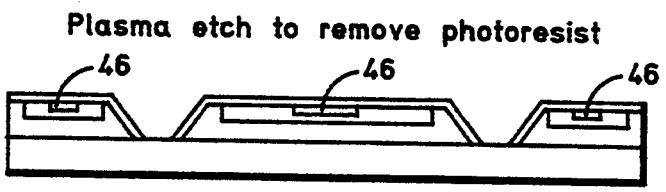
Figure 28:
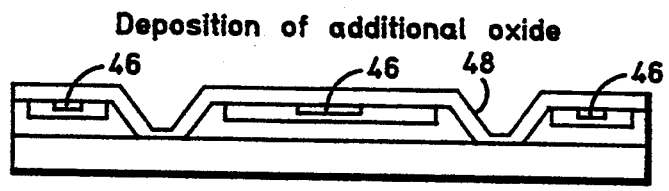

After the furnace anneal the wafer is patterned 38 using the extrinsic base photo level. The placement of this pattern is shown in FIG. 22. Open patterned areas 40, on the extrinsic base level, define regions for ohmic contacts to the intrinsic base. This helps reduce series resistance in the base area. The extrinsic base level also forms the emitter and collector regions of a vertical transistor such as that being fabricated by the process of the invention illustrated here. As shown in FIG. 23, desired species 42, at the appropriate dose and energy levels, are then implanted to yield desired electrical results. In FIG. 24 it can be seen that photoresist or pattern 38 is then removed, such as by a plasma etch process. The wafer is then patterned 44 using the emitter/collector photo level, as shown in FIG. 25. Open areas 45 on the emitter/collector level define regions for the emitters of the transistors as well as the collector plugs to help reduce the series collector resistance. In FIG. 26 desired species 46, at the appropriate dose and energy level, is then implanted to yield the desired electrical results. Photoresist 44 is then removed by a plasma etch process, for example, shown in FIG. 27.

Figure 29:
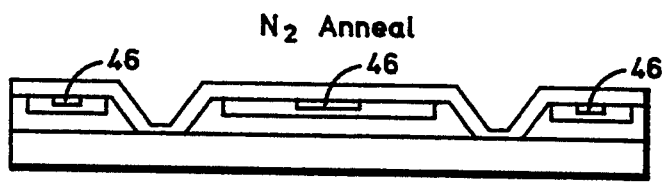
Figure 40:
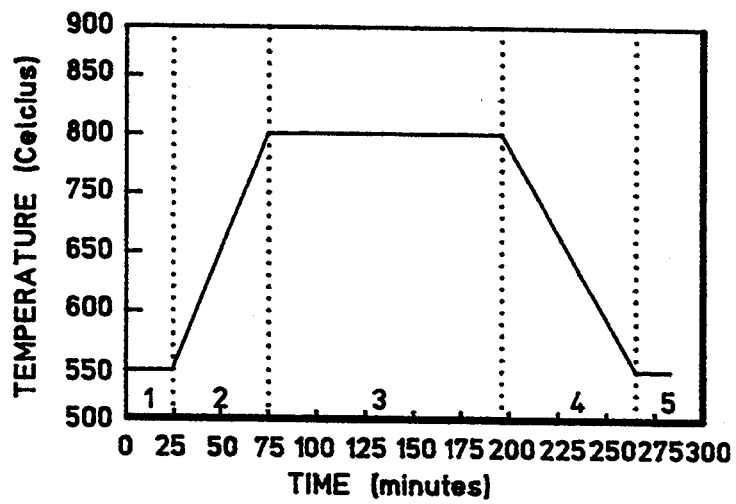
FIG. 40 is a representative furnace profile as may be used in an emitter, collector, and extrinsic base annealing step of the invention.

Afterwards, a layer of oxide 48 is deposited. This layer may be 5,000 angstrom±10%, for example. As shown in FIG. 29, the wafer is then annealed in a controlled ambient such as nitrogen. An exemplary furnace profile for this annealing step is shown in FIG. 40. In order to reduce collector leakage, anneal temperatures of no greater than 950° C. were allowed, with temperatures as low as 800° C. being tried. It was found that the low temperature anneals significantly reduced collector leakage current. At the lower temperature anneals, annealing time will most likely need to be longer than the higher temperature anneals so as to provide adequate time to repair damage caused by implants.

Figure 30:
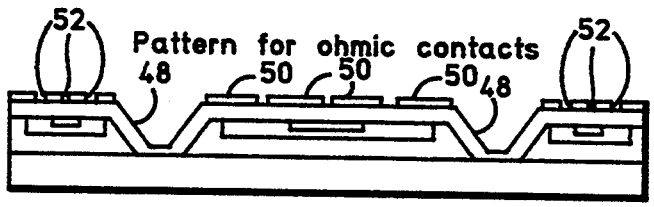
Figure 31:
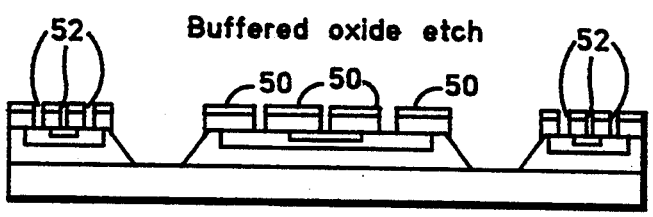

Contact level mask 50, shown in FIG. 30, defines areas 52 of the wafer to which metal will make eventual contact. As can be seen in FIG. 31, oxide layer 48 of FIG. 30 has been etched in these contact holes by way of a buffered oxide etch, for example. Oxide 48 is removed to make contact to the underlying silicon.

Figure 32:
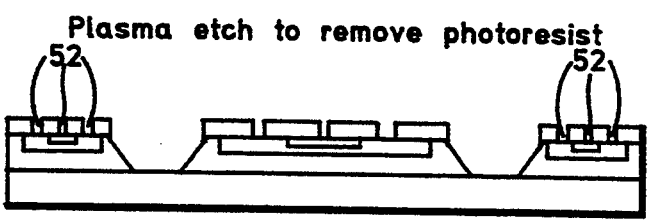
Figure 33:
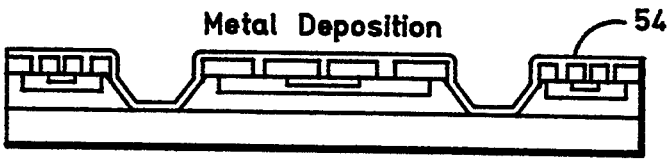
Figure 34:
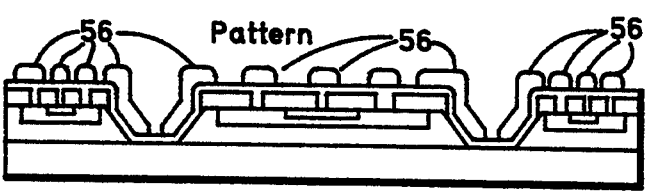

In FIG. 32 photoresist 50 has been removed, such as by a plasma etch process. As can be seen in FIG. 33, conducting metal (10,000 angstroms aluminum/1% silicon composition, for example) 54 is deposited across the wafer. Metal mask 56 then defines the areas where the conducting metal lines are to remain for interconnecting devices.

Figure 35:
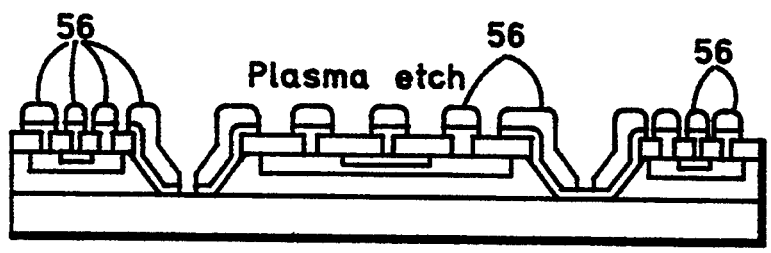
Figure 36:
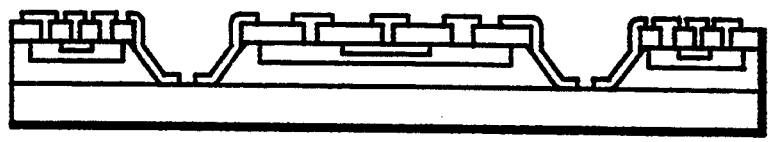
Figure 37:
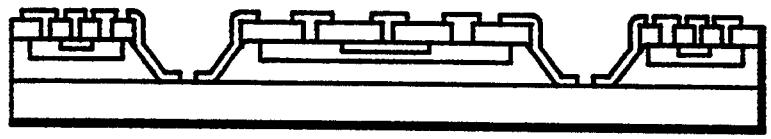

In FIG. 35 the conducting metal is etched, such as by a plasma. As shown in FIG. 36 a subsequent etching process, such as a plasma etch, removes undesired photoresist 56. In FIG. 37 a final anneal, such as at 400° C.±10%, sinters the metal aluminum composition in the silicon providing good ohmic contact to the devices of the operational amplifier.

Figure 41:
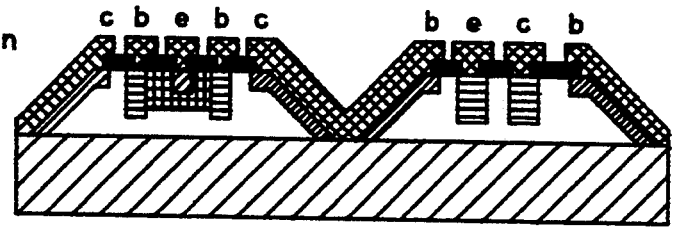
FIG. 41 illustrates a cross-sectional view of vertical NPN and lateral PNP transistors as may be fabricated according to the invention.

Final devices, a vertical NPN and lateral PNP bipolar junction transistors, such as may be constructed according to the invention are shown in cross-section in FIG. 41. The letters "c", "b" and "e" stand for collector, base and emitter, respectively.

Figure 42:
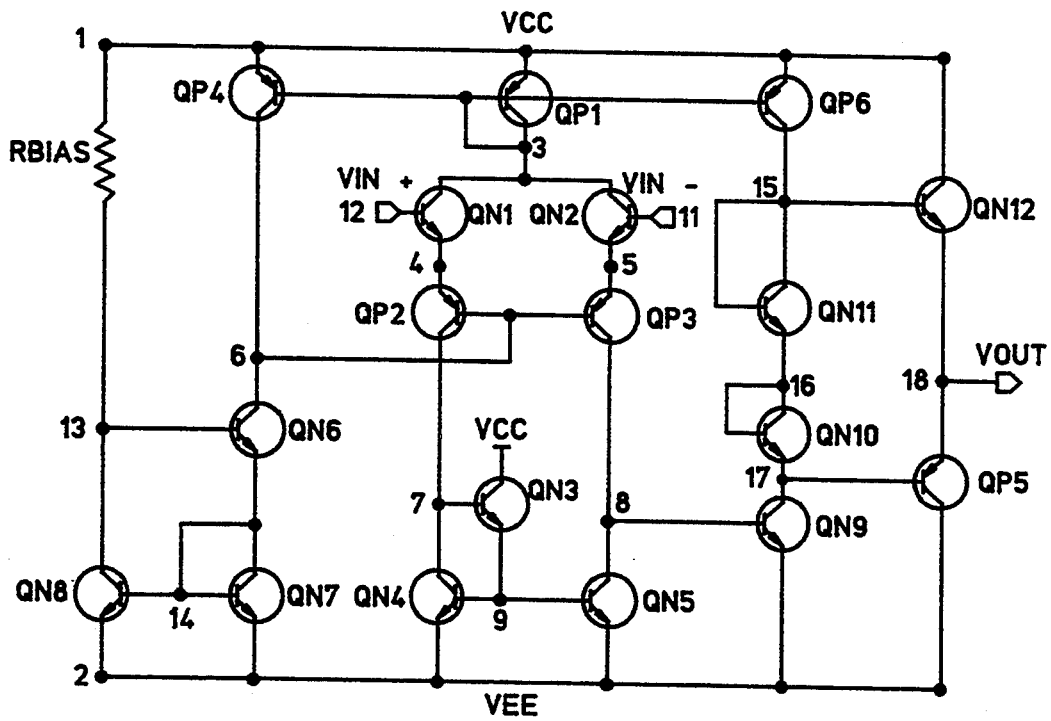
FIG. 42 is an operational amplifier schematic incorporating the bipolar junction transistors fabricated in silicon-on-sapphire according to the invention.
Figure 43:
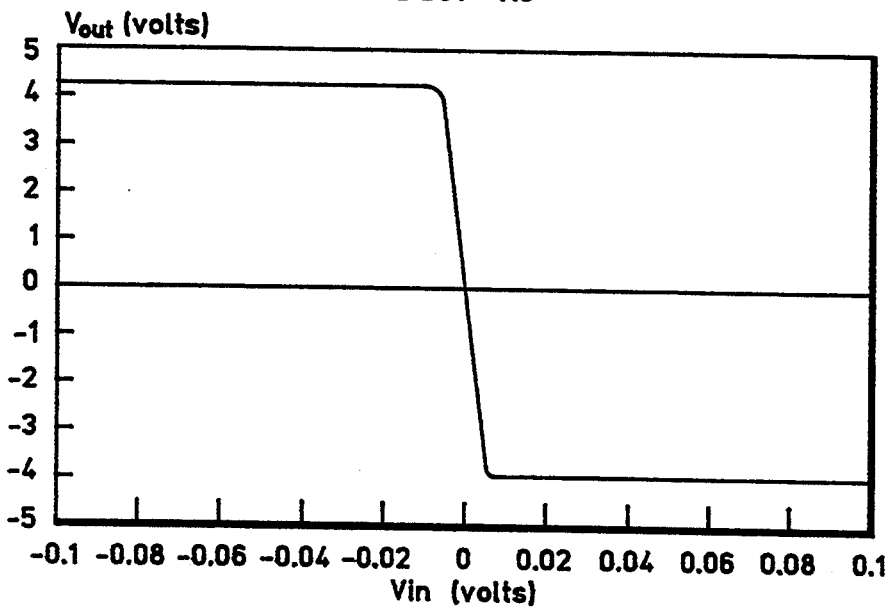
FIG. 43 is a direct current (DC) transfer curve of the operational amplifier shown in FIG. 42.

In FIG. 42 a schematic for an operational amplifier is shown designed to utilize the bipolar junction transistors of the invention. The transistors and other components shown are interconnected through conventional procedures known to those skilled in the art. In FIG. 43 the direct current (DC) transfer curve of the operational amplifier of FIG. 42 is shown.

Variations in implant doses (FIG. 19) and anneal temperatures (FIG. 29) were made to provide a test matrix in which to analyze temperature-related effects on the devices. The implant doses were $5 \times 10^{12}$ ion/cm$^2$, $10^{12}$ ion/cm$^2$ and $2 \times 10^{12}$ ion/cm$^2$. In the graphs to be shown, temperatures for the emitter anneal were 850° C. and 950° C. Though not shown, an emitter anneal temperature of 800° C. was also tried. After the implants and emitter anneals, a metal interconnect using titanium and Al/1%Si was used to provide adequate step coverage and minimized spiking into narrow emitter junctions.

Figure 44:
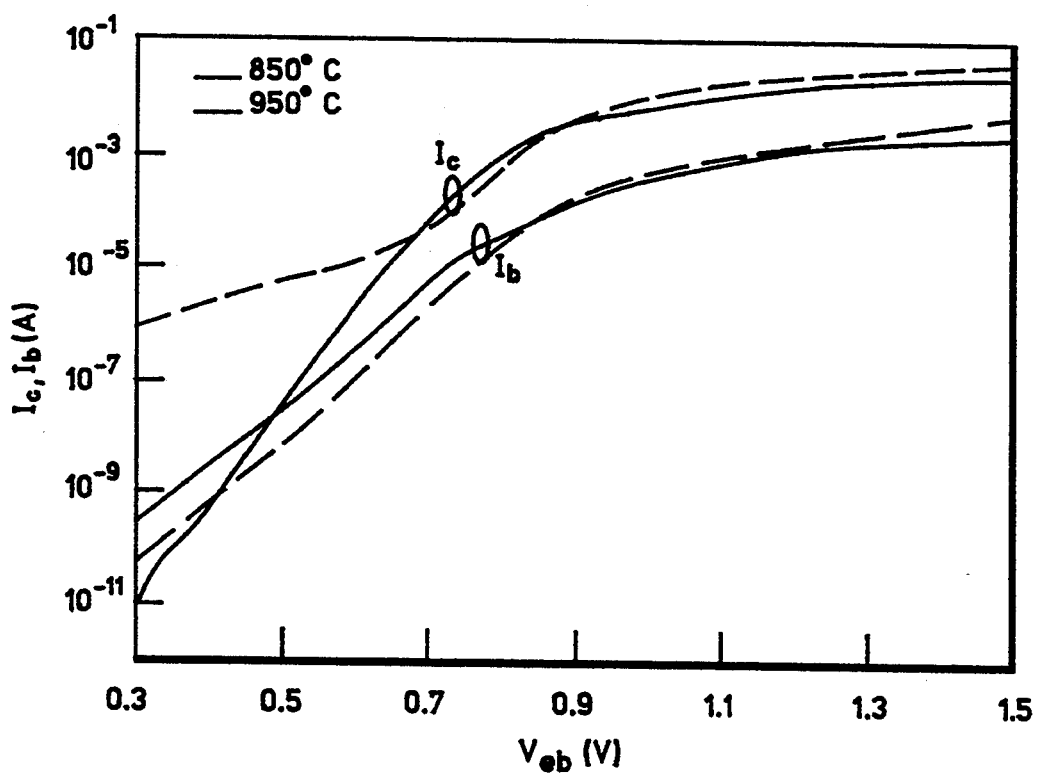
FIG. 44 shows measured Gummel plots for NPN devices.
Figure 45:
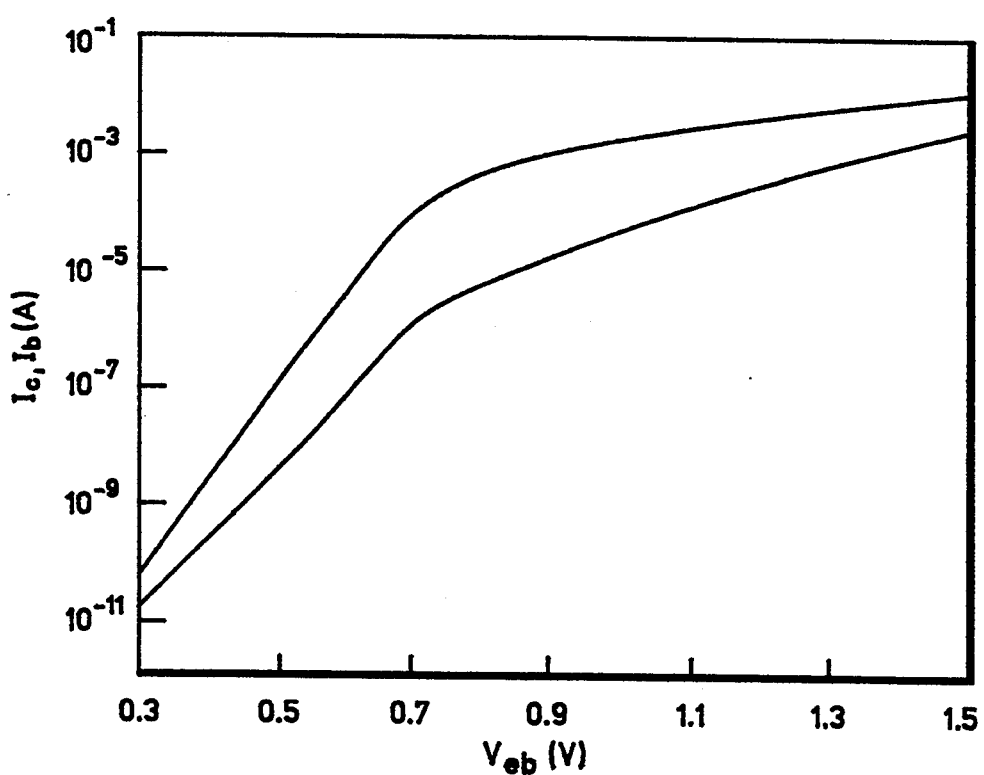
FIG. 45 shows measured Gummel plots for PNP devices.

Direct current (DC) characteristics were measured on NPN and PNP devices with a $1 \times 8$ $\mu$m$^2$ emitter. Measured Gummel plots for NPN devices, shown in FIG. 44, and PNP devices, shown in FIG. 45, display DC bipolar behavior. FIG. 44 shows an NPN transistor processed at 850° C., device NPN1, superimposed over one processed at 950° C., device NPN2. Device NPN2 exhibits five orders of magnitude higher collector leakage current than device NPN1. It should be noted that the base current in device NPN1 exhibits higher recombination than device NPN2, as evidenced by the shallower slope of NPN1 at base-emitter voltages less that 0.6 V. This effect is considered due to the lower (850° C.) processing temperature of device NPN1. The anneal time at 850° C. was most likely not long enough to anneal the damage caused by base and emitter implants. If it is desired to maintain high current gain and low collector leakage while decreasing the recombination rate, a different anneal temperature-time relationship must be developed. The measured current gain for the NPN devices is 30 and that of the PNP devices is 40.

Figure 46:
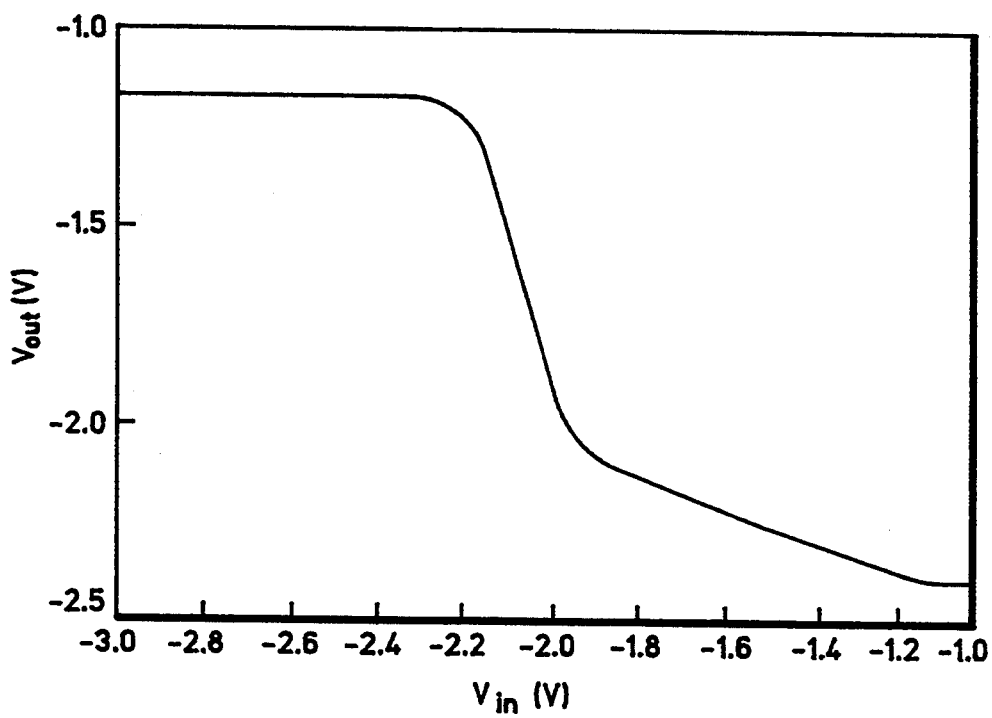
FIG. 46 is a transfer curve of a current mode logic (CML) inverter using NPN transistors fabricated according to the invention.

FIG. 46 is a transfer curve of a current mode logic (CML) inverter using NPN transistors fabricated according to the process of the invention. The transfer curve shows excellent DC transfer characteristics, with a 200 mV input signal driving the output from $-1.2$ V to $-2.2$ V indicative of the proper current steering mechanism behind CML circuits.

Figure 47:
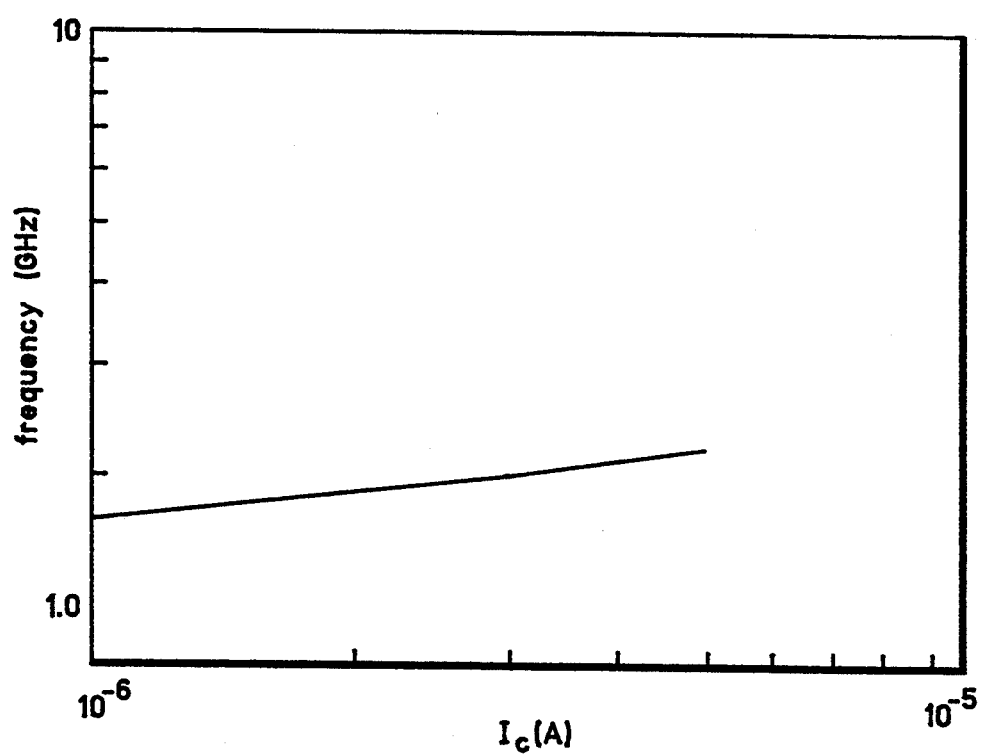
FIG. 47 shows frequency versus collector current for NPN transistors made according to the invention.

Alternating current (AC) measurements were made with a network analyzer on NPN transistors made according to the invention. Frequency ($f_t$) values were obtained for collector current $I_c$ variations of 10, 20, 30, 40, and 50 $\mu$A. Collector current variations above this amount could not be performed using these particular test structures without significant damage to the test devices. The data for $f_t$ versus $I_c$ are shown in FIG. 47. It can be seen from this figure that $f_t$ at 50 $\mu$A is 2.1 GHz. However, the curve appears to be on an upward slope and the maximum $f_t$ value is not reached within this set of data.

Through experimentation it has been shown that by using material improvement techniques for SOS processing, all implant technology, and reduced anneal temperatures, BJTs on SOS can be fabricated exhibiting relatively low emitter collector leakage, decent bipolar current gain, and suitable circuit performance. The same processing techniques have permitted the simultaneous processing of complementary vertical BJTs on SOS.

The invention permits the tailoring of epitaxial thickness and doping concentration to meet various design considerations without extraperipheral costs due to design modifications, that is, changing masks.

An advantage of the invention is the excellent isolation offered by utilizing SOS as an insulating substrate. High packing density, high radiation tolerance and latch-up immunity are additional advantages of this invention.

As an alternative embodiment, polysilicon as an emitter and base contact may be used to improve the invention by minimizing parasitic capacitances. Utilizing GeSi heterojunctions in the base region is another alternative to provide high-gain high-speed bipolar devices.

Obviously, many modifications and variations of the invention are possible in light of the above teachings. It is therefore to be understood that within the scope of the appended claims the invention may be practiced otherwise than as has been specifically described.

What is claimed is:

1. An improvement to a method for fabricating bipolar junction transistors in silicon-on-sapphire in which base and emitter regions are formed in a silicon wafer on a sapphire substrate, the improvement including:
   recrystalizing said silicon wafer prior to the formation of said base and emitter regions;
   forming said base and emitter regions through implantation; and
   annealing said emitter regions at a temperature not exceeding 950 degrees Celsius.

2. A method according to claim 1 in which said temperature falls within a range of 800 to 850 degrees Celsius.

3. A method according to claim 2 in which said step of recrystalizing said silicon wafer is known as double solid-phase epitaxy.

4. A method according to claim 2 in which said silicon wafer has an interfacing surface adjacent said sapphire substrate and a surface opposite of said interfacing surface, in which said step of recrystalizing said silicon wafer includes:
   amorphising said silicon wafer by the implantation of silicon in a region adjacent said interfacing surface, leaving a surface located non-amorphised region;
   crystalizing said silicon wafer in an anneal using said surface located non-amorphised region as a recrystalization seed;
   amorphising said silicon wafer by the implantation of silicon in a region adjacent said surface of said wafer, leaving an interfacing surface located non-amorphised region; and
   crystalizing said silicon wafer in an anneal using said interfacing surface located non-amorphised region as a recrystalization seed.

5. A method according to claim 1 in which said step of recrystalizing said silicon wafer is known as double solid-phase epitaxy.

6. A method according to claim 1 in which said silicon wafer has an interfacing surface adjacent said sapphire substrate and a surface opposite of said interfacing surface, in which said step of recrystalizing said silicon wafer includes:
   amorphising said silicon wafer by the implantation of silicon in a region adjacent said interfacing surface, leaving a surface located non-amorphised region;
   crystalizing said silicon wafer in an anneal using said surface located non-amorphised region as a recrystalization seed;
   amorphising said silicon wafer by the implantation of silicon in a region adjacent said surface of said wafer, leaving an interfacing surface located non-amorphised region; and
   crystalizing said silicon wafer in an anneal using said interfacing surface located non-amorphised region as a recrystalization seed.

7. A method according to claim 6 in which said temperature falls within a range of 800 degrees Celsius to 850 degrees Celsius.

8. An improvement to a method for fabricating bipolar junction transistors in silicon-on-sapphire in which base and emitter regions are formed in a silicon wafer on top of a sapphire substrate, said silicon wafer having an interfacing surface adjacent said sapphire substrate and a surface opposite of said interfacing surface, the improvement including:
   recrystalizing said silicon wafer prior to the formation of said base and emitter regions including the steps of:
      amorphising said silicon wafer by the implantation of silicon in a region adjacent said interfacing surface, leaving a surface located non-amorphised region;
      crystalizing said silicon wafer in an anneal using said surface located non-amorphised region as a recrystalization seed;
      amorphising said silicon wafer by the implantation of silicon in a region adjacent said surface of said wafer, leaving an interfacing surface located non-amorphised region; and
      crystalizing said silicon wafer in an anneal using said interfacing surface located non-amorphised region as a recrystalization seed;
   forming said base and emitter regions through implantation; and
   annealing said emitter regions at a temperature not exceeding 850 degrees Celsius.

* * * * *